United States Patent
Zhang et al.

(10) Patent No.: US 6,198,684 B1
(45) Date of Patent: Mar. 6, 2001

(54) WORD LINE DECODER FOR DUAL-PORT CACHE MEMORY

(75) Inventors: Kevin X. Zhang; Thomas D. Fletcher, both of Portland; Mandar S. Joshi, Aloha, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/471,654

(22) Filed: Dec. 23, 1999

(51) Int. Cl.[7] ...................................................... G11C 8/00
(52) U.S. Cl. ................................. 365/230.06; 365/230.05
(58) Field of Search .......................... 365/230.06, 230.05, 365/189.04

(56) References Cited

U.S. PATENT DOCUMENTS

| | | | |
|---|---|---|---|
| 5,317,536 | * 5/1994 | Aoyama | 365/189.04 |
| 5,335,199 | * 8/1994 | Aoyama | 365/230.05 |
| 5,812,486 | * 9/1998 | Shinmori | 365/230.08 |
| 6,005,794 | * 12/1999 | Sheffield et al. | 365/154 |

* cited by examiner

*Primary Examiner*—Son Mai
(74) *Attorney, Agent, or Firm*—Blakely, Sokoloff, Taylor & Zafman LLP (57) ABSTRACT

In one embodiment, a memory cell having a first port and a second port is provided. A first word line is associated with the first port, and a second word line is associated with the second port. A first driver is associated with the first word line, and a second driver is associated with the second word line. A decoder is associated with the first and second drivers.

12 Claims, 7 Drawing Sheets

WORD LINE DECODER FOR DUAL-PORT CACHE MEMORY

FIELD OF THE INVENTION

This invention relates generally to memory decoders, and in particular to decoders for a dual port cache memory.

DISCUSSION OF THE RELATED ART

Figure 1:
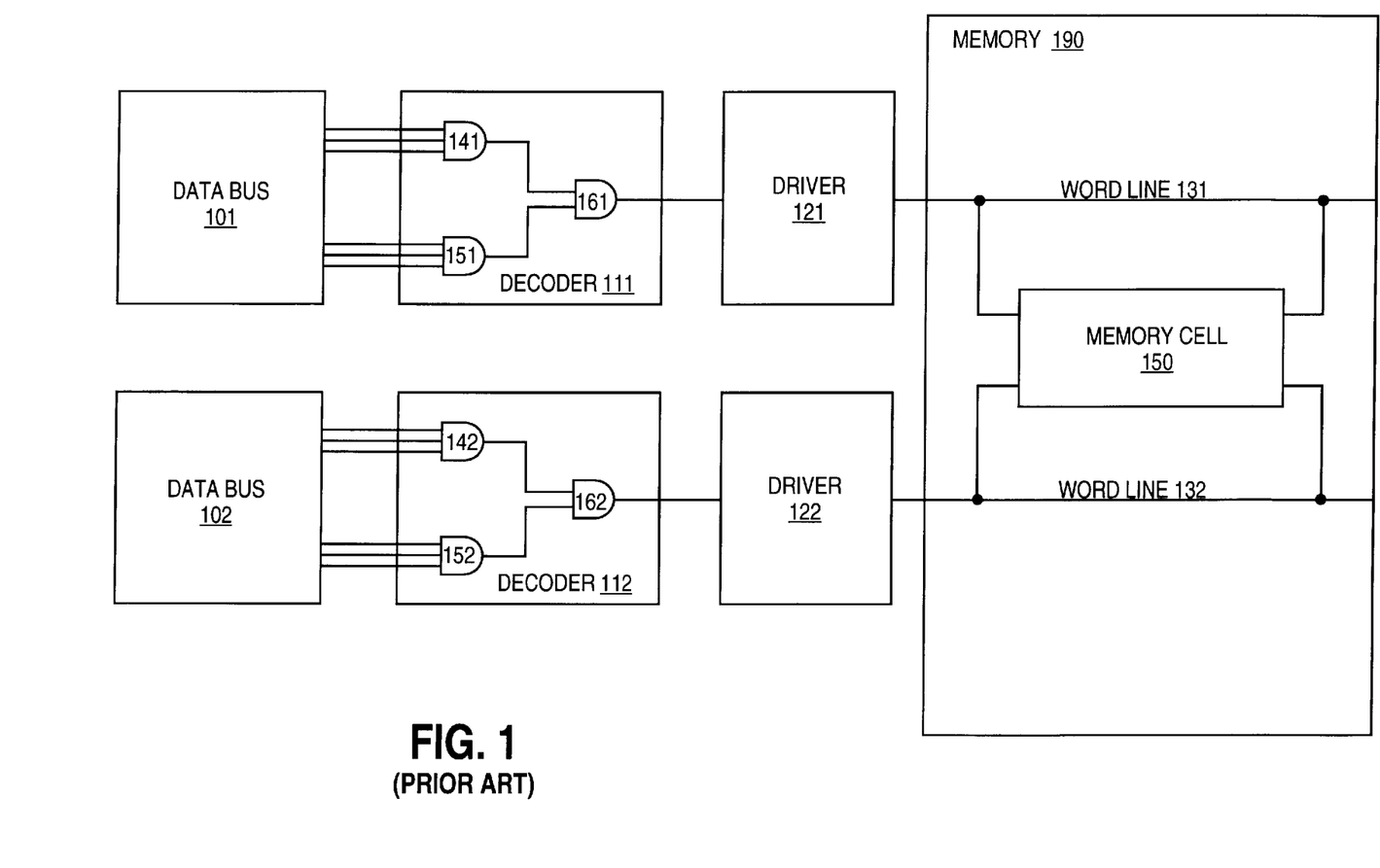
FIG. 1 is an example of prior art decoders.

An example of prior art decoders is shown in FIG. 1. In this example, cache memory 190 has 64 rows of memory cells. Therefore, the memory address of each row can be represented by six bits. Exemplary cell 150 of memory 190 is associated with two decoders 111, 112 that enable two corresponding drivers 121, 122 to drive corresponding word lines 131, 132 in order for a first or a second device to read the contents of memory cell 150.

Decoder 111 receives a memory address through bus 101 from a first device that wants to read from cache memory 190. Three of the address bits are received by first stage AND gate 141 and the other three bits are received by first stage AND gate 151. The outputs of the first stage AND gates 141, 151 are received by second stage AND gate 161. A second decoder 112 is required to receive a memory address through data bus 102 from a second device that wants to read from memory 190.

Figure 2:
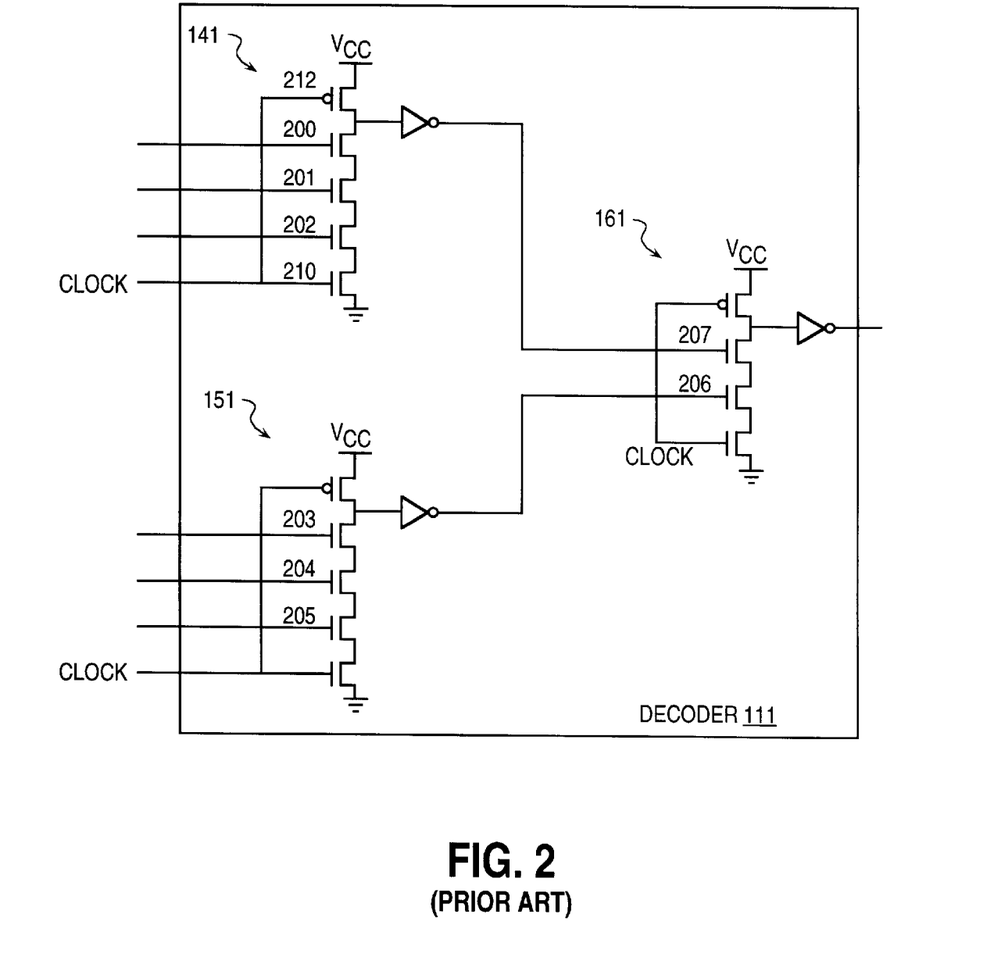
FIG. 2 is a circuit diagram of a prior art decoder.

FIG. 2 shows a circuit diagram of AND gates 141, 151 and 161. AND gate 141 receives bits 0 through 2 of memory address 101. Transistors 200, 201 and 202 are connected in series. Similarly, the transistors of AND gates 151 and 161 are also connected in series.

One disadvantage of the prior art decoders is that the transistors in each of the AND gates are connected in series, which causes a delay time in reading from memory 190. Another disadvantage in the prior art is that a dual port cache memory employs two completely separate and independent decoders. Furthermore, the decoders are multi-staged AND gates. As a result, the decoders consume a significant amount of area, leading to higher design overhead.

SUMMARY OF THE INVENTION

In one embodiment, a memory cell having a first port and a second port is provided. A first word line is associated with the first port, and a second word line is associated with the second port. A first driver is associated with the first word line, and a second driver is associated with the second word line. A decoder is associated with the first and second drivers.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 3:
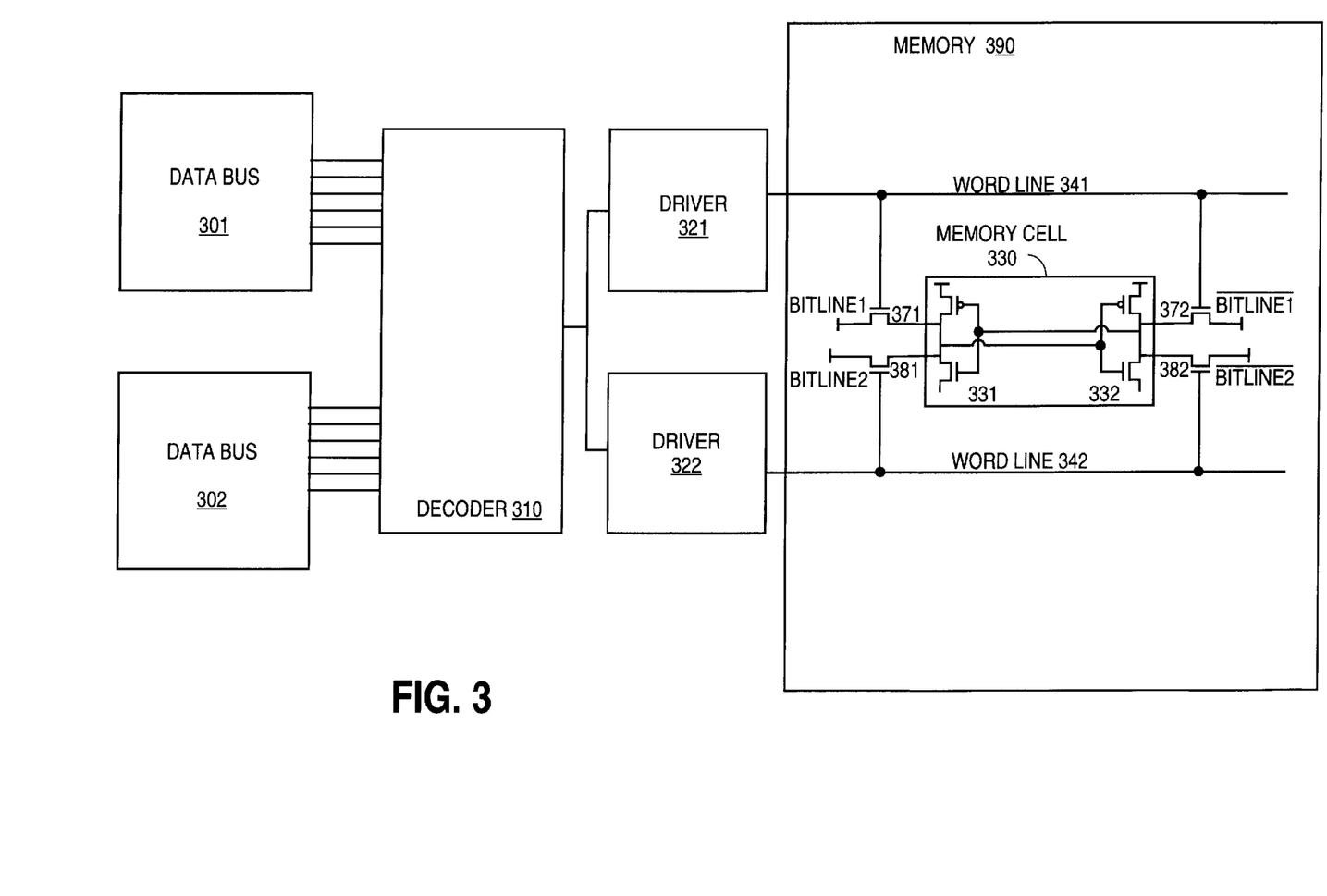
FIG. 3 is an embodiment of a decoder used in a dual port memory.

FIG. 3 shows one embodiment of a dual-wordline decoder used with a dual port cache memory. Memory 390 has multiple memory cells 330. Each memory cell 330 may be a bi-stable storage device, such as a pair of inverters 331, 332, connected back to back, for example. In a dual port memory, each cell 330 has two pairs of pass transistors, 371, 372, and 381, 382. Each pair of pass transistors is connected to the internal node of cell 330, where the data is stored. Each pair of pass transistors is also connected to a corresponding word line, either word line 341 or 342. The output of pass transistors 371, 372 is bit line 1 and complementary bit line 1, used to read the data stored in cell 330. The two pairs of pass transistors are two ports for accessing the data of cell 330. Therefore, memory 390 is a dual port memory.

A pair of word lines 341, 342 are associated with each cell in the memory. Each word line receives an input from a corresponding driver 321, 322. A single decoder 310 is used to enable the two drivers for the cell to drive each corresponding word line. One of the word lines, 341, provides access to the corresponding cell for a first device, such as an adder or a central processing unit (CPU), for example. The other word line, 342, provides access to the cell 330 for a second device, so that the second device can also read the data stored in the cell. A device reads the data in the memory cell by driving the corresponding word line for the cell. The device drives the appropriate word line by sending the memory address for the appropriate cell through a data bus to the decoders for the memory. The decoder for the appropriate word line decodes the memory address for the corresponding memory cell, and enables a driver to drive the word line so that the device can read the data stored in the memory.

For example, a first device sends the memory address of a cell 330 in memory 390 to the decoder 310 through data bus 301. The decoder 310 receives a memory address through bus 301. The decoder 310 then enables a first driver 321 to drive a first word line 341 so that data can be read from cell 330. If a second device wants to read from cell 330, the second device sends the memory address to decoder 310 through bus 302. The decoder 310 then enables a second driver 322 to drive a second word line 342, so that data can be read from cell 330.

Figure 4A:
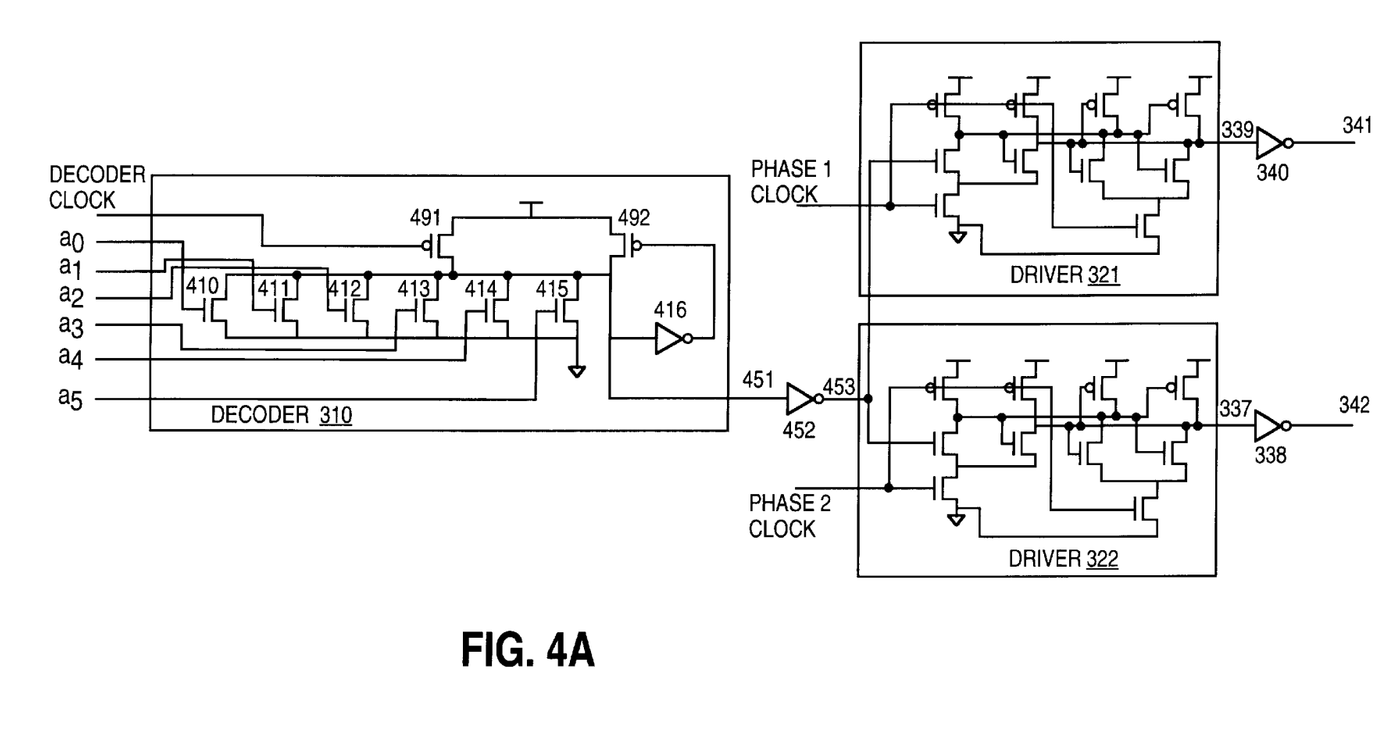
FIGS. 4A and 4B are embodiments of the decoder and devices shown in FIG. 3.

FIG. 4A shows one embodiment of the dual-wordline decoder 310. In this embodiment, decoder 310 is a dynamic NOR decoder, as represented by address transistors 410 through 415 and inverter 416. The number of address transistors corresponds to the number of bits needed to represent the address for the memory cells in memory 390. For example, if memory 390 has 64 rows of cells, then address transistors 410 through 415 receive the address bits $a_0$ through $a_5$ for corresponding memory cell 330. Transistors 491 is a precharge circuit that receive a decoder clock signal and enable the decoder to receive a memory address at the appropriate time. Transistor 492 is a keeper device to reduce the circuit noise.

In many high-speed cache applications, such as L0 cache memory, the addresses may be transmitted and received in redundant format, in which case the least significant bit of an address is received later than the other address bits. To reduce the timing impact of this late signal, the least significant address bit can be moved out of the NOR decoder, and can be used to act as a control signal along with the phase 1 and phase 2 clock signals, for the wordline drivers. The final stage of the late signal is thus clocked by a two-phase clock. Using the embodiment shown in FIG. 4B, the NOR decoder decodes bits $a_1$ through $a_5$ during the time that the apparatus 400 is waiting for the least significant bit $a_0$.

Figure 4B:
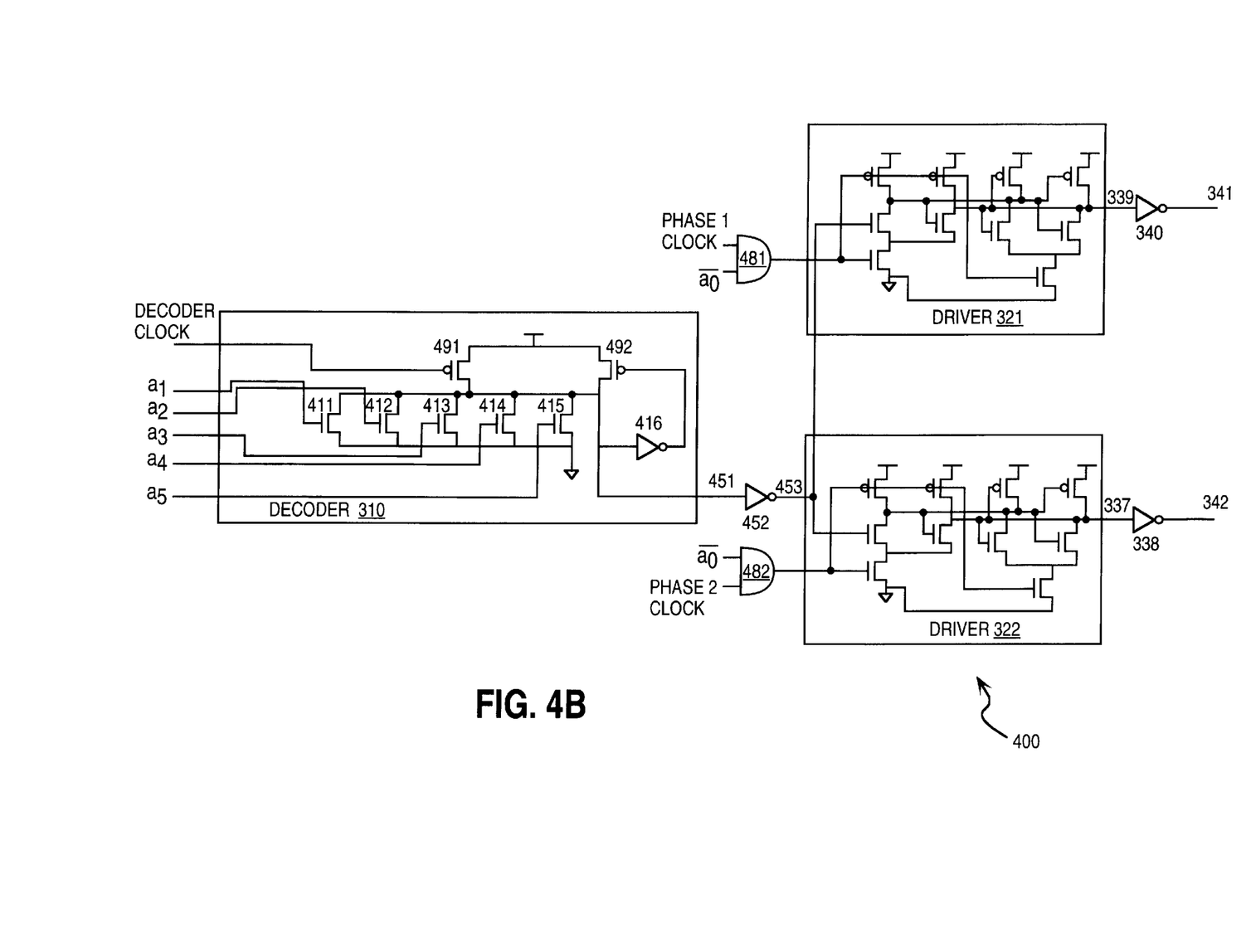

For example, as shown in FIG. 4B, the least significant bit $a_0$ is removed from the NOR decoder 310. The signal representing the complement of $a_0$ is input into AND gate 481, which also receives the phase 1 clock signal. Similarly, AND gate 482 receives the complement of $a_0$ and the phase 2 clock signal. Thus, the impact of the late transmission and receipt of signal $a_0$ is reduced, because the decoding in the NOR decoder 310 occurs without waiting for bit $a_0$.

An advantage of NOR decoder 310 is that the address transistors are connected to the voltage source in parallel. Connecting the transistors together in parallel reduces the delay time needed to turn on the transistors, and thus enables the transistors to decode faster than prior art decoders that connect address transistors in series.

Another advantage of NOR decoder 310 is that the decoder has a single stage. Because the NOR decoder has a single stage and the address transistors are connected in parallel, the NOR decoder operates much faster than AND decoders. Therefore, the clock signal used to control the NOR decoder can be twice as fast as the clock signal used to control the drivers 321, 322.

In the embodiments shown in FIGS. 4A and 4B, the output 451 of decoder 310 is input into inverter 452. The output 453 of inverter 452 is connected to the input of driver 321 and the input of driver 322. In one embodiment, as shown in FIGS. 4A and 4B, each driver 321, 322 is a single-rail to dual-rail converter. The output 339 of driver 321 may be connected to the input of inverter 340. The output 341 of inverter 340 is the first word line that is used to read memory cell 330 for the first device. The output 337 of driver 322 is input to inverter 338. The output 342 of inverter 338 is the second word line that is used by the second device to read memory cell 330.

Figure 5:
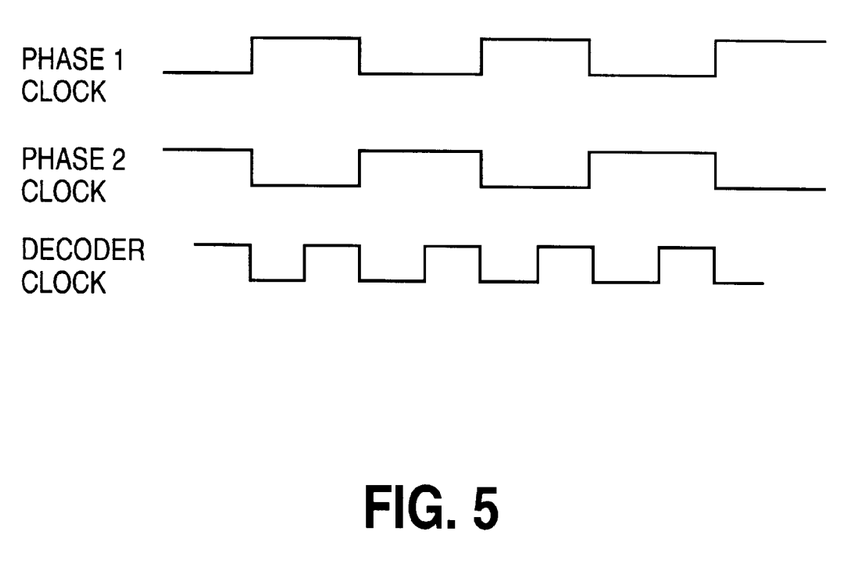
FIG. 5 shows the clock signals for the decoder and devices of FIGS. 3, 4A and 4B.

FIG. 5 shows the clock signals used to operate the decoder 310 and the drivers 321, 322. Clock phase 1 is used to control driver 321. Clock phase 2 is used to control driver 322. Clock phase 2 is the same frequency as clock phase 1, but is 180 degrees out of phase from clock phase 1. Thus, word line 1 can be driven to high when clock phase 1 is high, and word line 2 can be driven to high when clock phase 2 is high.

Figure 6:
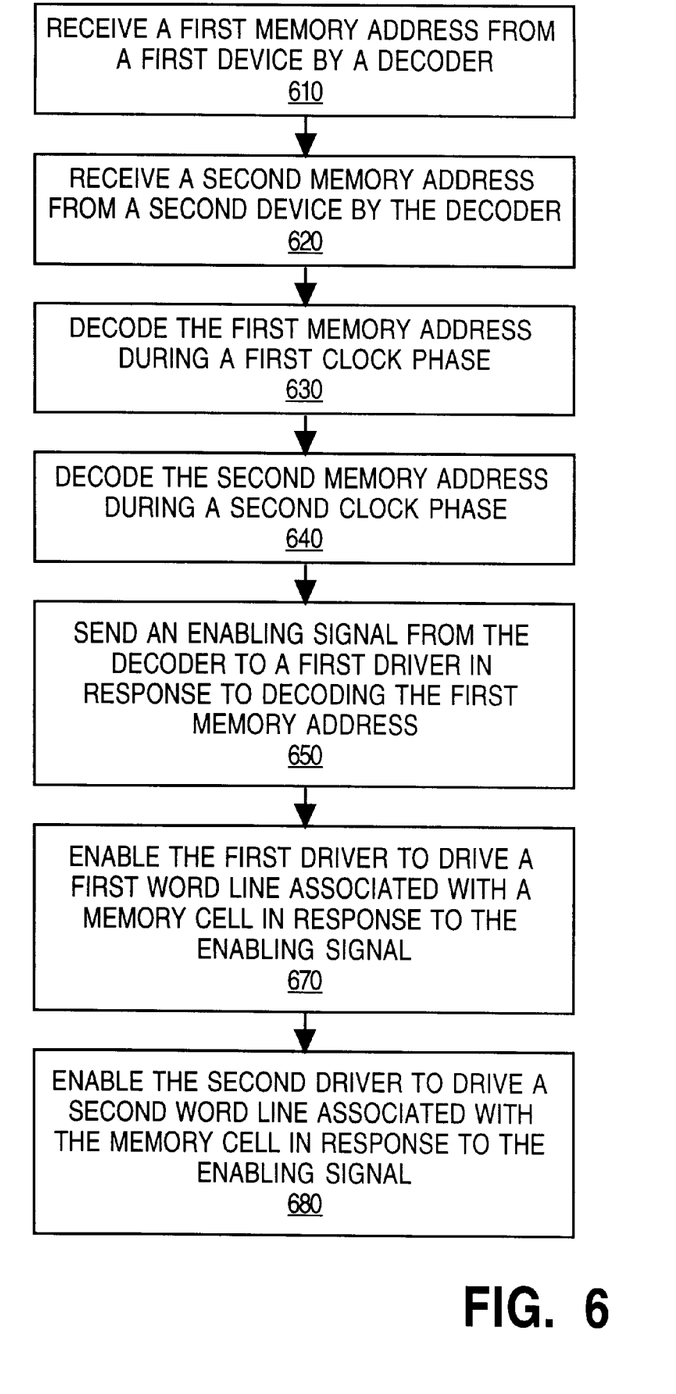
FIG. 6 shows an embodiment of a method for decoding.

FIG. 6 shows an example of an embodiment of a method for decoding using a single decoder in a dual port memory device. The method includes receiving a first memory address from a first device by a decoder, 610 and receiving a second memory address from a second device by the decoder, 620. The method also includes decoding the first memory address during a first clock phase, 630, and decoding the second memory address during a second clock phase, 640. An enabling signal is sent from the decoder to a first driver in response to decoding the first memory address, 650. The first driver is enabled to drive a first word line associated with a memory cell in response to the enabling signal, 660. An enabling signal is sent from the decoder to a second driver in response to decoding the second memory address, 670. The second driver is enabled to drive a second word line associated with a memory cell in response to the enabling signal, 680.

The clock used to control the decoder 310 is twice the frequency of the clocks used to control the drivers. Because a single decoder has to be able to enable two drivers during a single cycle, the decoder 310 has to operate at twice the frequency of drivers 321, 322. Decoder 310 is able to operate at a frequency that is twice the operating frequency of its corresponding drivers because the decoder is a single stage NOR decoder.

The decoder 310 improves the performance of processing systems. For example, high performance CPUs demand cache memory with both higher access speed and wider bandwidth. A way to meet these requirements is to use dual-port caches, which can greatly increase the data throughput of caches. One of the advantages that the decoder 310 provides to dual-port memory is enabling the wordline decoders to handle two addresses during one clock cycle while keeping the area overhead small. Thus, decoder 310 can be made very small, reducing the area overhead and loading of address drivers.

An additional advantage of decoder 310 is that it has a smaller layout area than the prior art AND decoder. Furthermore, the decoder 310 is faster than the prior art AND decoder. Therefore, decoder 310 can include a clocking scheme to provide two-phase decoding to enable handling of two addresses in one clock cycle for dual-port memory. The NOR decoder 310 drives two wordline drivers, controlled by signals phase 1 and phase 2, respectively. The two separate wordline drivers are controlled by signals in opposite phase at a normal clock frequency. Because the decoder 310 is a single stage decoder, the decoding is done in a single stage, and decoder 310 is fast enough to be clocked at double the frequency of the normal clock used by drivers 321, 322. Therefore, the decoder 310 can be shared by two wordline drivers and provide two-address decoding within one normal cycle.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

What is claimed is:

1. An apparatus comprising:
    a memory cell having a first port and a second port;
    a first word line associated with the first port;
    a second word line associated with the second port;
    a first driver associated with the first word line;
    a second driver associated with the second word line;
    a decoder associated with the first and second drivers; and
    wherein the decoder is a single state decoder.

2. The apparatus of claim 1, wherein the decoder receives memory addresses from a first device and a second device.

3. The apparatus of claim 2, wherein the decoder decodes the memory address received from the first device during a first clock phase, and decodes the memory address received from the second device during a second clock phase.

4. The apparatus of claim 3, wherein the decoder is a NOR decoder.

5. A method comprising:
    receiving a first memory address from a first device by a decoder;
    receiving a second memory address from a second device by the decoder;
    decoding the first memory address during a first clock phase;
    decoding the second memory address during a second clock phase; and
    sending an enabling signal from the decoder to a first driver in response to decoding the first memory address.

6. The method of claim 5 further comprising enabling the first driver to drive a first word line associated with a memory cell in response to the enabling signal.

7. The method of claim 6 further comprising sending an enabling signal from the decoder to a first driver in response to decoding the second memory address.

8. The method of claim 7 further comprising enabling the first driver to drive a second word line associated with a memory cell in response to the enabling signal.

9. An apparatus comprising:
- means for receiving a first memory address from a first device;
- means for receiving a second memory address from a second device;
- means for decoding the first memory address during a first clock phase;
- means for decoding the second memory address during a second clock phase; and
- means for sending an enabling signal to a first device in response to decoding the first memory address.

10. The apparatus of claim 9 further comprising means for enabling the first driver to drive a first word line associated with a memory cell in response to the enabling signal.

11. The apparatus of claim 10 further comprising means for sending an enabling signal to a second driver in response to decoding the second memory address.

12. The apparatus of claim 11 further comprising means for enabling the second driver to drive a second word line associated with a memory cell in response to the enabling signal.

* * * * *